United States Patent
Perera (10) Patent No.: US 10,072,362 B2
(45) Date of Patent: Sep. 11, 2018

(54) METHOD FOR MAKING A POLYMER-SHEATHED MULTI-FILAMENTARY STRAND

(71) Applicant: Pascale Industries, Inc., Pine Bluff, AR (US)

(72) Inventor: Willorage Rathna Perera, Raynham, MA (US)

(73) Assignee: Pascale Industries, Inc., Pine Bluff, AR (US)

( * ) Notice: Subject to any disclaimer, the term of this patent is extended or adjusted under 35 U.S.C. 154(b) by 197 days.

(21) Appl. No.: 14/999,786

(22) Filed: Jun. 27, 2016

(65) Prior Publication Data

US 2017/0370026 A1 Dec. 28, 2017

(51) Int. Cl.

| | | |
|---|---|---|
| *B29B 13/02* | (2006.01) | |
| *B29B 15/12* | (2006.01) | |
| *B29B 15/14* | (2006.01) | |
| *B29C 70/16* | (2006.01) | |
| *D02G 3/04* | (2006.01) | |
| *D02G 3/18* | (2006.01) | |
| *D02G 3/12* | (2006.01) | |
| *D02G 3/36* | (2006.01) | |
| *D02G 3/44* | (2006.01) | |
| *H01B 7/00* | (2006.01) | |
| *H01B 7/18* | (2006.01) | |

(Continued)

(52) U.S. Cl.
CPC ............ *D02G 3/047* (2013.01); *B29B 15/122* (2013.01); *B29C 47/025* (2013.01); *B29C 70/021* (2013.01); *B29C 70/023* (2013.01); *B29C 70/025* (2013.01); *D02G 3/045* (2013.01); *D02G 3/12* (2013.01); *D02G 3/182* (2013.01); *D02G 3/185* (2013.01); *D02G 3/36* (2013.01); *D02G 3/441* (2013.01); *H01B 7/0045* (2013.01); *H01B 7/1865* (2013.01); *H01B 13/24* (2013.01); *H01B 13/26* (2013.01); *H01B 13/2613* (2013.01); *H01B 13/2686* (2013.01); *H05K 9/009* (2013.01); *H05K 9/0088* (2013.01); *H05K 9/0098* (2013.01); *B29C 2035/0283* (2013.01); *D10B 2101/06* (2013.01); *D10B 2401/16* (2013.01)

(58) Field of Classification Search
CPC ....... B29B 13/02; B29B 15/12; B29B 15/122; B29B 15/14; B29C 2035/0283; B29C 47/025; B29C 70/021; B29C 70/023; B29C 70/025; B29C 70/16; D02G 3/04; D02G 3/045; D02G 3/047; D02G 3/18; D02G 3/182; D02G 3/185; D02G 3/36; D02G 3/441; D10B 2401/16; H01B 13/24; H01B 13/26; H01B 13/2613; H01B 13/2686
USPC ......... 264/80, 103, 104, 105, 135, 136, 137, 264/171.13, 171.23, 211
See application file for complete search history.

(56) References Cited

U.S. PATENT DOCUMENTS

5,460,883 A * 10/1995 Barber, Jr. ............... A46D 1/00
428/370
6,828,501 B2 12/2004 Eves et al.
(Continued)

*Primary Examiner* — Leo B Tentoni
(74) *Attorney, Agent, or Firm* — Michael de Angeli (57) ABSTRACT

A polymer-sheathed multi-filamentary strand for use in braided covers for wiring harnesses intended for use in challenging embodiments comprises a core of glass filaments wrapped in an aramid yarn, and sheathed in a siloxane-modified polyetherimide polymer. Shielding against electromagnetic interference may also be provided.

5 Claims, 3 Drawing Sheets

(51) Int. Cl.
    *H05K 9/00*          (2006.01)
    *H01B 13/26*        (2006.01)
    *H01B 13/24*        (2006.01)
    *B29C 70/02*        (2006.01)
    *B29C 47/02*        (2006.01)
    *B29C 35/02*        (2006.01)

(56) References Cited

U.S. PATENT DOCUMENTS

| | | |
|---|---|---|
| 8,236,376 B2 | 8/2012 | Perera et al. |
| 8,735,725 B2 | 5/2014 | Li |
| 9,111,658 B2 | 8/2015 | Shah et al. |
| 2003/0175490 A1* | 9/2003 | Furukawa ............... D02G 3/047 |
| | | 428/299.4 |
| 2005/0019580 A1* | 1/2005 | Yasuhiro ................. B29C 59/08 |
| | | 264/80 X |
| 2010/0055445 A1* | 3/2010 | Wu ....................... G03G 15/162 |
| | | 428/327 |
| 2015/0107890 A1 | 4/2015 | Mann et al. |

\* cited by examiner

METHOD FOR MAKING A POLYMER-SHEATHED MULTI-FILAMENTARY STRAND

FIELD OF THE INVENTION

This invention relates to polymer-sheathed multi-filamentary strands optimized for high-temperature and otherwise challenging applications. For example, such polymer-sheathed multi-filamentary strands are needed for manufacture of braided covers for wiring harnesses for trucks, heavy equipment, pure electric or hybrid automobiles, jet engines and like applications, wherein the harness covers must withstand high temperatures, resist abrasion, and avoid degradation of their physical properties, such as stiffening, cracking, or coating rupture during flexing, upon exposure to any of a wide variety of aggressive corrosive liquids found in such environments, and furthermore must do so over many years. In some circumstances it would also be useful to incorporate shielding against electromagnetic interference (EMI) into the strand.

BACKGROUND OF THE INVENTION

As indicated above, this invention is directed to improved polymer-sheathed multi-filamentary strands that can be braided in order to cover wiring harnesses in harsh environments, such as the engine compartments of heavy trucks, construction equipment, jet aircraft, and the like. These polymer-sheathed multi-filamentary strands must avoid degradation in their physical properties despite exposure to the high temperatures and corrosive (meaning by "corrosive" to include all manner of chemical activity, including solvent action and the like) liquids found in such environments for periods of many years. Other requirements on such polymer-sheathed multi-filamentary strands will be apparent and will be discussed further below, such as abrasion resistance and the ability to be handled readily, so as to be wound onto spools and to be braided into wiring harness covers without difficulty. Cost of course is always important.

It will be appreciated that the engine compartments of vehicles such as heavy trucks, construction equipment, jet aircraft and the like are very harsh environments, and that components intended for use in such environments must meet many challenges. In particular, with engines growing to be of higher and higher power output, temperatures continue to rise in these engine compartments such that components such as polymer-sheathed multi-filamentary strands employed for braided covers for wiring harnesses face significantly more difficult temperature tolerance requirements. More specifically, polymers were previously considered satisfactory as the material for sheathing multi-filamentary strands for braided wiring harnesses covers if capable of withstanding temperatures of 280° F. (137° C.) over a period of years without stiffening, cracking, or other failure even if repeatedly flexed. The service temperatures now contemplated require these materials to withstand temperatures of 392° F. (200° C.), which is a substantial increase. At the same time, the materials must be unaffected by long-term exposure to various corrosive substances found in such environments, such as gasoline, diesel fuel, jet fuel, coolants, battery acid, oil, grease, windshield washer fluid, brake and other hydraulic fluids, steam, and the like. It is also important that the polymer sheath in particular be resistant to abrasion, as there is inevitable vibration with respect to metal components in these environments, such that if not sufficiently abrasion-resistant the sheath could chafe through, for example, at the points where the wiring harness is secured in position, leading to failure.

In addition to these service requirements, the materials of the polymer of the sheath and of the yarn must be suitably processable, meaning that their characteristics must be such that the polymer can be extruded over a multi-filamentary strand at high speed using conventional processing equipment, in order to manufacture the polymer-sheathed multi-filamentary strands, and that the polymer-sheathed multi-filamentary strands can then be braided to manufacture covers for wiring harnesses on conventional equipment, for reasons of economical production.

These requirements on the materials of the sheath and multi-filamentary strands are complex, particularly in connection with the polymer of the sheath, in that the polymer must be melted in order that it can be extruded over the multi-filamentary strand. In order that the polymer can be extruded using conventional equipment, the melting temperature of the polymer cannot be too high, yet as noted the polymer must be capable of withstanding relatively high temperatures in service over a period of many years. This places a severe constraint on the polymer. In addition, the sheathed yarn, typically of 30-40 mil diameter with about 14 mil sheath thickness must be flexible enough for winding onto cardboard tubes and downstream processing such as rewinding and braiding. If the yarn is not flexible enough, the yarn tends to slough off the cardboard tube and it becomes very difficult to handle or rewind. Additionally, if the sheath is too stiff, the yarn may spring back from the braided structure or break during the braiding operation. Similarly, the materials of the sheath and multi-filamentary strand cannot be too costly for economical production and use.

Therefore, it is an object of the invention to select materials and processing techniques that result in a polymer-sheathed multi-filamentary strand that is resistant to high temperatures, various corrosive materials, and abrasion, that is sufficiently flexible for convenient downstream processing, and wherein the materials can be processed on conventional equipment using generally conventional techniques, at reasonable cost of the ultimate product.

In a further aspect of the invention, required for use in connection with modern vehicles which are largely controlled by microprocessors, it is desired to incorporate shielding against electromagnetic interference (EMI) into the yarns making up the braided wiring harness cover, so as to prevent the wire bundle protected by the wiring harness cover from acting as a noise radiating antenna or as a receiver for outside EMI, which might distort the signals being carried, which in turn might cause various operational difficulties. Such EMI shielding is desired in many of the same applications as intended for the high-temperature resistant strands discussed above, e.g., the engine compartments of trucks and heavy equipment, jet engines, and otherwise. Provision of EMI shielding generally requires the provision of at least one grounded conductive layer or wire surrounding the wiring to be protected, which serves to absorb, drain or reflect electromagnetic energy. A polymer-coated strand suitable for being braided into a wiring harness cover incorporating EMI shielding would accordingly be a useful product.

SUMMARY OF THE INVENTION

Selection of a polymer for the sheath was the initial step in making the invention. As noted there are several severe constraints on the polymer, some of which are self-contradictory, in particular the requirement that the polymer have a melting point that is low enough to allow it to be extruded using conventional equipment yet be resistant to failure under extended exposure to high temperatures in service. The polymer must also be resistant to a wide variety of corrosive and chemically-active substances found in the harsh under-hood environment, must be abrasion-resistant, must be flexible and rewindable, must be processable at commercial speeds of on the order of 1000 ft/minute, and cannot be too costly.

The requirement that the polymer can be extruded using conventional equipment immediately eliminates a large class of polymers that might otherwise be suitable, namely the fluorocarbon polymers. In particular, when processed at high temperatures, as during extrusion, fluorine from the fluorocarbon polymers tends to react with humidity to form hydrofluoric acid. As is well-known, hydrofluoric acid is highly corrosive, such that conventional extrusion equipment tends to be damaged beyond use in only a few hours of operation. It would be possible to obtain extrusion equipment manufactured of corrosion-resistant alloys, but these are cost-prohibitive. Additionally, to protect employees from being exposed to harmful fumes, fluorocarbon polymers must be processed under fume hoods, requiring significant capital investment.

A thorough testing program was performed whereby the published specifications of a large number of commercially-available polymers were first examined for suitability, in particular whether the glass transition temperature $T_g$ was close to the anticipated service temperature while the melting point was low enough to allow processing using conventional extrusion equipment. More particularly, the glass transition temperature $T_g$ in an amorphous polymer is the temperature at which the polymer transitions from a glassy state to a rubbery state; stated differently, below $T_g$ the polymer behaves in an increasingly brittle manner. If the glass transition temperature $T_g$ is too close to the anticipated service temperature the polymer is likely to fail in service. In the present case, given that the in-service temperature was anticipated to be 392° F. (200° C.), the minimum $T_g$ was set to 363° F. (184° C.). This eliminated many polymers from consideration.

Using a polymer the $T_g$ of which is below, yet close to, the service temperature for the sheath of the multi-filamentary yarn has several advantages. For example, at the service temperature such a material is flexible, preventing micro crack formation during bending or due to abrasion due to vibration. The avoidance of micro cracks also prevents the various corrosive fluids from penetrating into the polymer matrix, which would tend to shorten the product life cycle. Since the service temperature is close to but higher than its $T_g$, the mobility of the long molecular chains of the polymer is relatively low. This can mitigate deformation of the material, so that it will retain its physical dimensions in use. Additionally, if the service temperature is somewhat higher than $T_g$ but below the melting temperature $T_m$, the polymer could become lightly tacky, so that adjacent fibers will be bonded to one another, providing superior properties to the wiring harness cover, and minimizing unravelling if one yarn is broken.

As mentioned, the polymer must also be sufficiently flexible at room temperature to allow various processing operations such as winding onto spools and braiding to be performed successfully. This flexibility is measured by the "flex modulus" of the polymer; accordingly, this quality was evaluated as well.

Next, the melting point of possible polymers was considered. Here the principal consideration was that the melting point was required to be low enough to allow extrusion using conventional equipment, that is, at not more than about 700° F. (371° C.). The combined requirements of a suitable $T_g$, lower than but near to the operating temperature, suitable flex modulus, and relatively low melting point eliminated further possible polymers.

Next, chemical resistance testing was undertaken. This was performed in two stages. First, samples of the remaining possible candidate polymers were obtained and used to fabricate solid plaques about 20 mils thick. These were immersed in the various chemicals of interest, as listed above, and observed over a period of weeks. The polymers which survived this test were then used to fabricate polymer-sheathed multi-filamentary strands, using conventional extrusion and related processing equipment. The chemical resistance testing of extruded polymers was repeated, both at room and (where the chemicals were nonflammable) at elevated temperatures. These steps also led to rejection of several polymer possibilities.

Next, polymer-sheathed multi-filamentary strands made from the remaining possible polymers and differing multi-filamentary strands (discussed below) were tested at high temperatures for long periods. The successful candidate polymer was essentially unaffected after being tested at 392° F. (200° C.) for 16 weeks.

More specifically, the polymer eventually selected is a polyetherimide (PEI) modified by being mixed with a siloxane. Preferably the polymer to be employed is a mixture of several different versions of siloxane-modified PEI sold as Siltem 1500, Siltem 1600, and Siltem 1700, initially developed by General Electric and now sold by SABIC (Saudi Arabia Basic Industries Corporation) of Devens, Mass. These grades vary in the amount of siloxane added to the PEI (parent or virgin) material. Siltem 1500 has the greatest amount of siloxane added, Siltem 1600 a medium amount, and Siltem 1700 the least. A product known as Ultem 1000 is the PEI with no siloxane. The properties of the materials vary accordingly, with Siltem 1500 being the least rigid and therefore the most easily extruded and downstream processed but having a lower $T_g$, while Siltem 1700 has the highest heat tolerance, but is comparatively difficult to process, rewind and braid. The heat tolerance and the flexibility of a desired product can be customized by mixing the three grades at varying proportions. The $T_g$ of pure PEI is about 446° F. (230° C.) while that of the Siltem 1600 siloxane-mixed PEI, for example, is about 383° F. (195° C.). Furthermore, the melting temperature range of Siltem 1600 siloxane-modified PEI is 590-620° F. (310-326° C.), so that the material can be processed using conventional extrusion equipment. In the testing process, it was also found that the Siltem polymers selected as above were suitable for processing to form the polymer-sheathed multi-filamentary strand using conventional equipment and at high speeds, e.g., at least 1200 feet per minute, and for subsequent braiding to cover wiring harnesses.

In order that polymer-sheathed multi-filamentary strands could be fabricated for use as material for braiding wiring harness covers, it was also necessary to select suitable materials for the core multi-filamentary strands. These materials also must tolerate high temperatures in processing and in service, must be processable in manufacture of the strand and later in the braiding operation, and must also provide most of the tensile strength of the ultimate product. Multi-filamentary yarns consisting of metal, glass, carbon, aramids known as Kevlar® or Twaron, or PEI were considered. Each one of these has their own advantage or disadvantage. For example, multi-filamentary metal wires are heavy and so produce lower yield end product. Carbon is very light in weight (density 1.8 g/cm$^3$), and can be readily processed, but is cost prohibitive. The aramids known as Kevlar® or Twaron are known to withstand high temperature and were potential candidates, but are available only at premium cost ($14-$17/lb). Glass ($1-2/lb) is another candidate although the brittleness of the glass filaments could be a serious issue when processing through a small extrusion die; broken filaments can accumulate at the tip either breaking the line or resulting in defective product. PEI multi-filamentary yarns are also available but they do not have enough tenacity, that is, if a load is applied the material tends to elongate and may fail.

Accordingly, the primary candidates for the multifilamentary core yarn were glass filaments and aramids, in particular that sold by DuPont as Kevlar®; another possible aramid is that sold as Twaron®. Glass has good heat tolerance and is inexpensive, but, as noted above, glass filaments are difficult to process as the relatively brittle individual filaments making up the multi-filamentary strand tend to break entering the extrusion die, eventually causing failure of the operation. Kevlar® is suitable as the material of the multi-filamentary strand, but is comparatively expensive. It was also noted that the Siltem polymers also adhere better to glass, especially when it has been treated with compatible silanes or tie resins, than to Kevlar®.

After extensive experimentation, a composite multi-filamentary strand comprising an inner core of glass filaments wrapped with a multi-filamentary Kevlar® strand so as to partially expose the glass core was settled upon. The Kevlar® protects the glass filaments from the die during extrusion, by securing the continuous glass filaments when entering the die, by axially aligning any broken filaments that may be poking out from the filament bundle, and by substantially preventing direct contact between the glass filaments and metal machine components, while the partial exposure of the glass ensures good adhesion of the polymer of the sheath to the core.

Finally, abrasion testing was performed by oscillating a weighted section of the polymer-sheathed multi-filamentary strand back and forth over the sharp edge of a hexagonal steel bar, and recording the number of cycles to failure. The materials selected as described above performed well in this testing.

As mentioned above, in many circumstances it would also be useful to add EMI shielding to the polymer-coated multi-filamentary strand for braiding into wiring harness covers, in order to provide EMI shielding to the wires enclosed by the wiring harness, which is especially desirable if they transmit data or control signals, as opposed to power. It will be understood that in many cases the wires themselves will comprise some EMI shielding, and further that by the nature of the braided wiring harness cover the EMI shielding provided thereby will exhibit gaps, both between the strands making up the wiring harness cover and at the wiring harness junctions where the braid must be made partially intermittent. Nonetheless a useful degree of EMI shielding can be provided by a wiring harness cover braided of a polymer-coated multi-filamentary strand incorporating EMI shielding. The openings in the braided harness cover can be substantially mitigated by provision of a double-braided cover with an appropriate braiding style such that openings in the inner braided layer are effectively covered by the overlapping layer, all without sacrificing flexibility of the harness.

Wires and cables formed to comprise EMI shielding are well-known, of course, the simplest being the typical coaxial cable used to make, e.g., radio antenna connections, comprising a solid central conductor sheathed in a dielectric layer, in turn shielded by a metallic foil or braid, covered in a protective sheath of polymer. The signal is carried by the central conductor, while the foil or braid is grounded by way of a termination fitting connected thereto. The foil or braid serves to absorb and reflect EMI and prevent corruption of the signal, and prevent cross-talk between adjoining cables. Cables are also known comprising multiple individually insulated wires all sheathed in a single braid or foil, again with a polymer outer protective layer. Commonly a drain wire is provided in contact with the fragile foil or braid, to ensure longevity of the ground connection, that is, in order to drain away any electrical charge that may accumulate on thereon due to EMI.

More recently, the subject of providing EMI shielding to wires or cables using sheaths of polymers filled with magnetic or conductive materials such as short metal filaments with high aspect ratios, high surface area metal micro flakes (such as silver flakes, as provided by Technic Inc., of Rhode Island, or specially formulated micro steel flakes provided by Daido Steel, of Japan), carbon particles, and carbon nanostructures (such as single wall or multi-wall carbon nano tubes) in lieu of the metallic foil or braid has become of interest. See, e.g., Shah U.S. Pat. No. 9,111,658 and Mann application 2015/0107890. Also generally relevant are Li U.S. Pat. No. 8,735,725, showing a cable employing a polymer containing carbon black so as to make it conductive, serving as an EMI shield, and Eves U.S. Pat. No. 6,828,501, showing a cable comprising braided conductors spaced from one another by an insulating yarn. However, no references are known showing a polymer-coated multi-filamentary strand incorporating an EMI shield for use in manufacture of a braided cover for wiring harnesses.

BRIEF DESCRIPTION OF THE DRAWINGS

The invention will be better understood if reference is made to the accompanying drawings, in which.

DETAILED DESCRIPTION OF THE PREFERRED EMBODIMENTS

Figure 1:
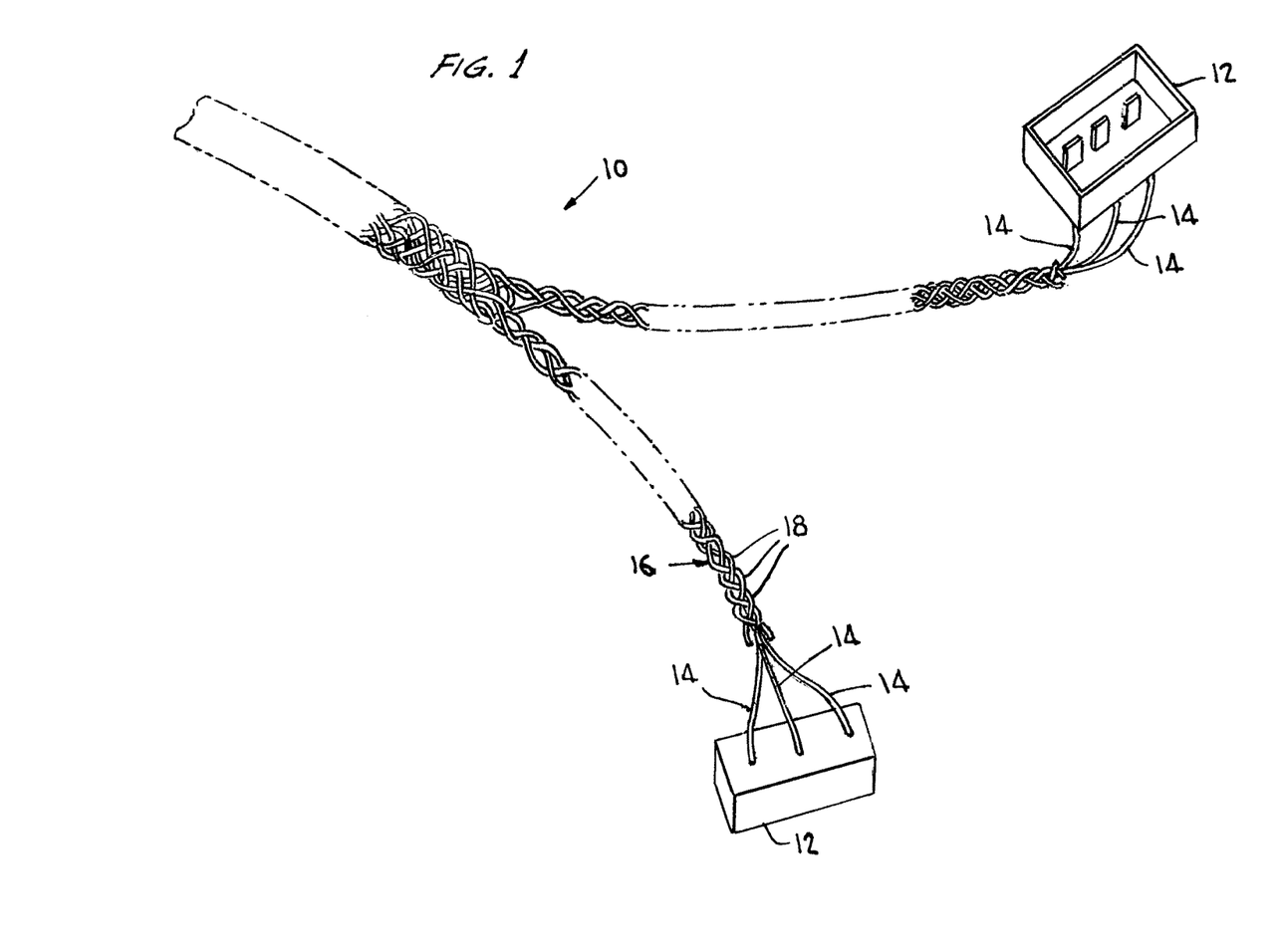
FIG. 1 is a perspective view of a section of a wiring harness having had a cover made of the polymer-coated multi-filamentary strands according to the invention braided thereover.

As described above, this application relates to manufacture of polymer-coated multi-filamentary strands for use in braided covers for wiring harnesses intended for use in harsh environments, such as under the hoods of automobiles, trucks and construction equipment, for jet engines, and the like. FIG. 1 illustrates schematically a portion of such a wiring harness 10. As illustrated, the wiring harness 10 comprises a plurality of connectors 12 for being plugged into mating connectors on an engine or the like. Each connector serves to terminate one or more wires 14. The wires 14 are protected by a braided cover 16, formed by braiding a plurality of the polymer-sheathed multi-filamentary strands 18 according to the invention over wires 14. The manufacture of wiring harnesses, and the braiding of covers thereover, are well-known in the art and are performed in the conventional way for the purposes of this application.

Figures 2, 4:
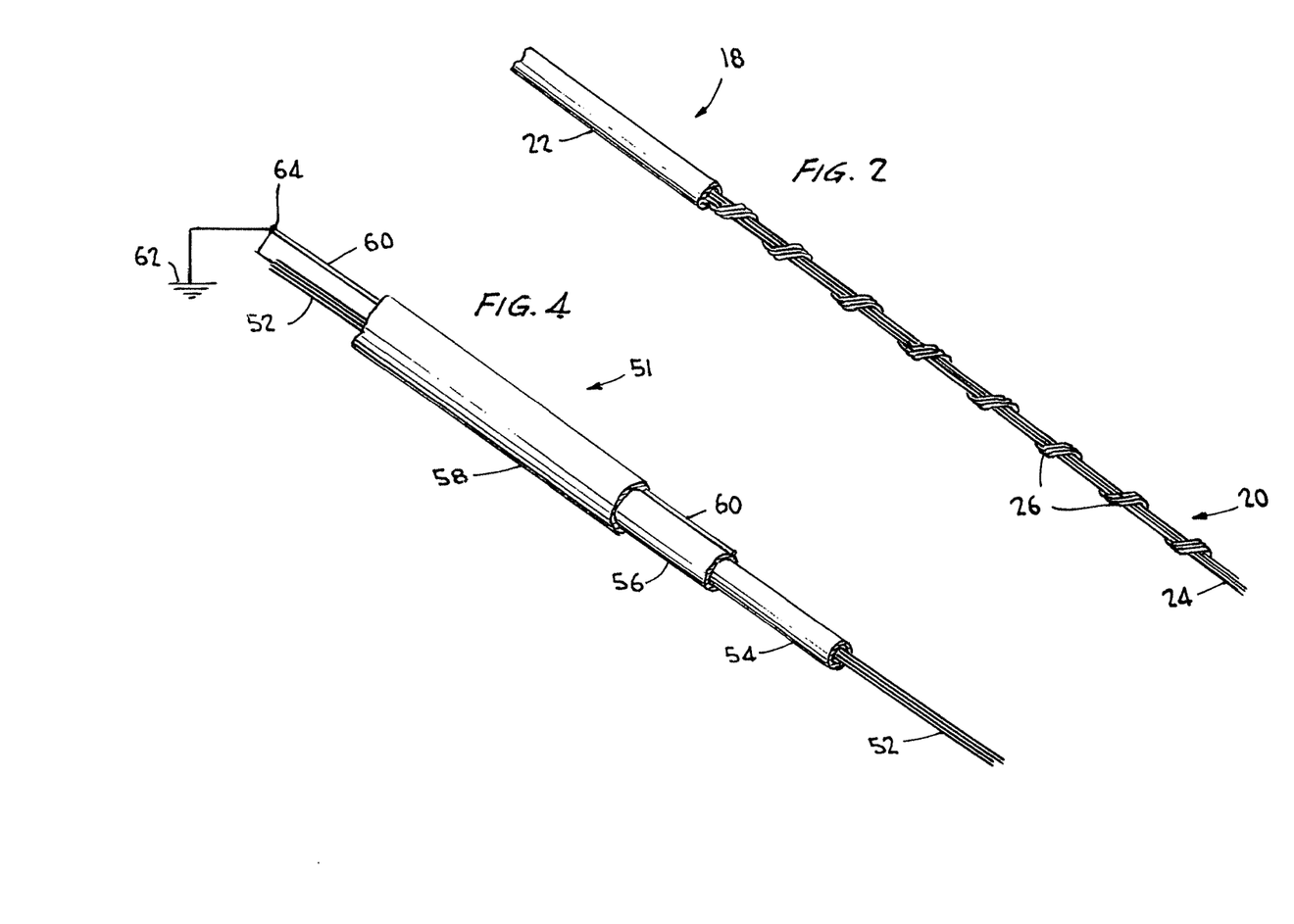
FIG. 2 is a partially exploded perspective view of a first embodiment of the polymer-coated multi-filamentary strands according to the invention.
FIG. 4 is a partially exploded perspective view of a second embodiment of the polymer-coated multi-filamentary strands according to the invention, incorporating EMI shielding.

FIG. 2 shows a perspective, partially exploded view of one of the polymer-sheathed multi-filamentary strands 18 according to the invention. As illustrated, polymer-sheathed multi-filamentary strand 18 comprises a core 20 in a polymer sheath 22. In turn, core 20 comprises a yarn comprising a large number of glass filaments 24 partially wrapped in a yarn 26 of an aramid material such as that sold as Kevlar®. In this way, several advantages are realized, as follows.

If a core of glass only were employed, difficulty in processing would be anticipated. More particularly, formation of the polymer-sheathed multi-filamentary strand requires the polymer of the sheath 22 to be extruded over the core 20. If glass filaments alone were used as the core, it is to be expected that some of the glass filaments would break at the entrance to the extrusion die within which the polymer, having been melted, is extruded over the core, due to friction between the glass fibers and the die or misalignment of the fibers at the die entry. The breakage could lead to jamming of the core in the die and possibly to breakage of the strand itself, especially at the high speeds, e.g., 1200 feet per minute, at which the process is performed.

An aramid such as Kevlar® or Twaron® could be used exclusively as the material of the core. However, Kevlar® is expensive as compared to glass (e.g. $14-17/lb for Kevlar® as opposed to $1-2/lb for glass). Therefore use of Kevlar® alone as the material of the core would be cost-prohibitive. Further, it has been observed that the adhesion of many polymers to glass is better than to Kevlar®, especially if the glass is treated with a silane or tie resin, as discussed further below.

Therefore, the solution depicted was chosen. A yarn 26 of Kevlar® is wrapped over a yarn comprising a large number of glass filaments 24. In this way the Kevlar® yarn keeps the glass filaments aligned axially, so that any broken filaments are forced to enter the coating die parallel to the yarn axis and so that the Kevlar® wrap protects the glass to a considerable extent from contact with the extrusion die during extrusion. Further, by providing a partial wrap of the Kevlar®, so that a significant fraction of the surface of the glass is exposed to the polymer of the sheath, a good bond is formed between the glass 24 of core 20 and the sheath 22, and the cost of the product is kept within reasonable bounds. Further, Kevlar® is less dense than glass (1.44 g/cm$^3$ for Kevlar®, 2.5 g/cm$^3$ for glass); weight reduction is always desirable, especially in aircraft applications. The wrapping of Kevlar® may also limit peeling of the polymer sheathing in the axial direction.

Typical desired diameters of the end product polymer-sheathed multi-filamentary strand 18 are 28 and 40 mils. The preferred thickness of the sheath 22 is between about 5 and about 9 mils; if excessive polymer is used, the polymer-sheathed multi-filamentary strand 18 becomes too stiff for convenient braiding, and the cost of the polymer (on the order of $25/lb) becomes excessive.

Typical specifications of the glass yarns are those sold by PPG Industries of Pittsburgh, Pa. as G75, which comprises 400 filaments, each 9 microns in diameter, making a 10.6 mil yarn; G37, comprising 800 9-micron filaments, making a 15.6 mil yarn; and G150, which comprises 200 filaments, each 9 microns in diameter, making an 8 mil yarn.

Typical multi-filamentary Kevlar® yarns are 1200 denier, which is 15 mils in diameter, 1000 denier, which is 14 mils in diameter, and 400 denier, which is 9 mils in diameter.

Successfully tested cores for a 28-mil polymer-sheathed multi-filamentary strand 18 comprised a G150 glass yarn wrapped at 0.5 wraps/inch by a Kevlar® yarn of 400 denier, while a 40 mil strand comprised a core of G75 glass yarn likewise wrapped by a Kevlar® yarn of 400 denier. The wrap rate can be varied between about 0.25 and 1 wraps/inch, depending on the precise product specifications desired. The wrap rate is chosen so as to leave a substantial fraction, e.g., between about 10% and 90%, of the surface of the multi-filamentary yarn of glass filaments exposed to ensure effective bonding of the polymer sheath thereto in the extrusion step. The thickness of the polymer sheath varies depending on whether it is measured over the Kevlar® yarn, but is approximately 10 mils where the Kevlar® yarn is not present, and 5.5 mils over the Kevlar® yarn.

Figure 3:
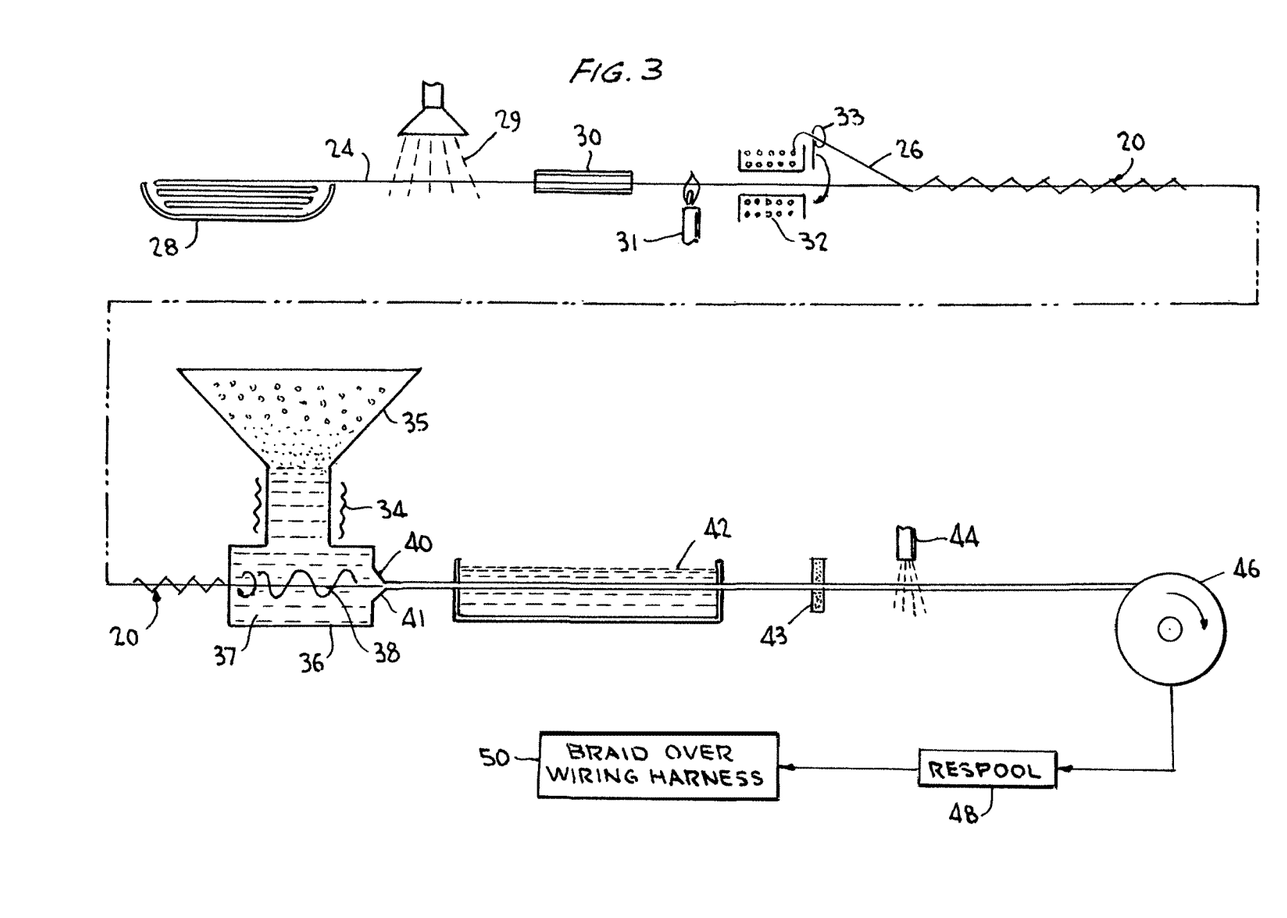
FIG. 3 illustrates the principal steps in manufacture of a braided cover for a wiring harness according to the invention.

FIG. 3 illustrates the principal steps in manufacture of a braided cover for a wiring harness according to the invention, as mentioned above. At 28, the glass yarn is removed from a creel on which it is supplied. Preferably, unless the glass yarn is supplied silane-coated, a silane is applied to the yarn at 29.

The purpose for application of a silane is to provide chemical coupling between the glass and siloxane-modified PEI, so as to substantially strengthen the bond therebetween and render the polymer-sheathed multi-filamentary yarn more durable in service. The use of silanes to increase adhesion between glass fabrics and polymers, for example, epoxy, is well-known in the manufacture of, e.g., circuit boards. A preferred silane is A1100 originally offered by Union Carbide Corp. and currently offered as Silquest A-1100 having the chemical formula "Gamma amino tri-ethoxy silane" by Momentive Performance Materials Inc. of Waterford, N.Y.

The silane can be applied by spraying a mixture of the silane in water at a concentration of, e.g., 0.1-0.3% onto the yarn, as illustrated at 29; alternatively, the silane can be applied by passing the yarn through a bath of similar composition. As noted, glass filamentary yarns are also commercially available having been pretreated with silane; if these are used, this step can be omitted. So-called "tie layer resins" such as acrylic acid or maleic anhydride may alternatively be applied to the yarn, e.g., by a process referred to by the art as "grafting", to improve adhesion of the polymer sheath. However, these were not tested, particularly for high temperature performance.

After silane application at 29, the glass yarn is passed through a tube furnace at 30, to dry it. The yarn may first be drawn through a slitted sponge followed by an air wipe (neither shown), to remove most of the water. To further activate the surface, the yarn then passes through a high intensity singeing gas flame at 31. The latter step provides several advantages. Heating the glass promotes and accelerates the chemical reaction between the silane and PEI, further improving their respective bonding. The high intensity flame caramelizes any starch binder that may have been applied by the manufacturer of the glass yarn, and the roughened surface provided by caramelizing increases the mechanical bond between the PEI of the sheath 22 and the glass 24 of the core 20. Finally, the flame also activates the surface of the filaments of the glass 24, further promoting adhesion between the glass and PEI. Alternatively, the yarn can be passed through a corona, comprising a stream of ionized gas molecules, achieving much the same effect.

The glass yarn 24 thus prepared is then wrapped in a yarn 26 of an aramid such as Kevlar® to thereby manufacture the core 20. As noted, the wrapping is carried out partially, that is, so that 10-90% of the surface of the glass yarn is not covered by the aramid yarn but is exposed to the polymer. The wrapping can be carried out by passing the glass yarn 24 through the center of a spool 32 of the aramid yarn 26, with the aramid yarn passing through an eyelet 33 driven to rotate around the glass strand. The rate of rotation of the eyelet 33 is controlled with respect to the linear speed of the glass yarn 24 to achieve the desired wrap rate and the degree to which the glass is exposed.

Properly dried pellets of the selected polymer in a hopper 35 are then melted by a heater 34, and extruded over the core 20 at 36. More specifically, as is well-known in the extrusion art, the core 20 is passed into a chamber 37 containing molten polymer pressurized by a driven screw 38, so that as the core 20 exits chamber 37 through a tip 40 and die 41, the tip 40 serving to correctly locate the core 20 in the center of die 41, polymer is uniformly extruded over core 20, so that the size of the die 41 thus controls the final diameter and shape of the polymer-sheathed multi-filamentary strand 18.

The polymer-sheathed multi-filamentary strand 18 thus made is cooled, typically in a water bath 42, dried by passing through a slitted sponge 43 and being subjected to an air blast at 44, and wound onto a cardboard tube at 46. Typically up to 18 pounds of product can be wound onto a tube in this step. If needed, water-based chemicals can be added to the water bath to induce desired engineering properties to the end product; for example, it may be desired to add a small amount of a tackifier (Stahl RU41-065 5% or WF 357 10%) to the water of the bath 42 to provide some adhesion between the strands as they are wound onto the tube. It will also be appreciated by those of skill in the art that it will typically be efficient to first wind the strand as it leaves the water bath onto large tubes, as described above, and later to rewind the strand at step 48 onto smaller tubes containing about 0.3-1.5 pounds of final product, to suit the requirements of conventional braiding equipment.

Finally, at step 50 the strand is braided over a pre-existing wiring harness to form the braided cover. As indicated above, the braiding of strands to form wiring harnesses is a well-established art.

Further salient details of the specifics of the manufacture of the strands according to the invention are found in the Tables discussed below. More specifically, Tables 1-8 detail the extensive research program that was carried out by the inventor in order to select the optimal polymer for practice of the invention, and provide further details of the processing steps employed.

Table 1, below, lists the principal requirements on the polymer of the sheath 22, and the number of potential polymer candidates. As indicated, as the number of required characteristics increases, the number of viable candidates decreases, leaving only a few possibilities.

TABLE 1

Complexity in Polymer Selection and Potential Options

| Braid Yarn Selection Requirement | Options |
|---|---|
| Heat tolerance at 392 F. | 100+ |
| Chemical resistance/Auto fluid | 75+ |
| Cost affordable below $25 | 50+ |
| Non fluoro polymers only | 25+ |
| Below 700 F. processing only | 15+ |
| Standard screw & barrel only | 12 |
| Extrudable on standard equipment | 10 |

TABLE 1-continued

Complexity in Polymer Selection and Potential Options

| Braid Yarn Selection Requirement | Options |
|---|---|
| No high temp extruder | 10 |
| Extrudable at 1000+ feet/min | 8 |
| Flexible/Windable on tubes | 5 |
| Flexible and rewindable on braid tubes | 3 |
| Flexible and braidable | 3 |
| Abrasion over 500 cycles | 3 |

More specifically, the polymer of the sheath must exhibit the following qualities, as listed:

Ability to withstand temperatures of up to 392° F. (200° C.) for periods of many years without degradation, such as stiffening or cracking. It is important that at the high working temperatures anticipated, the material is in a leathery/rubbery condition, that is, somewhat flexible, which mitigates the tendency to crack. Those of skill in the art will recognize that many polymers contain organic plasticizers provided to induce flexibility, and that at high temperatures, such plasticizers tend to outgas, leaving behind stiff and cracked surfaces. In contrast, the ductility of the Siltem siloxane-modified PEI polymers is not due to the presence of plasticizers but because linearly-chained flexible siloxane groups are bonded between the PEI molecules. This is an added advantage of using the Siltem materials.

Resistance to degradation despite exposure to numerous corrosive and chemically-active fluids found in the underhood environment, such as gasoline, diesel fuel, jet fuel, coolants, battery acid, oil, grease, windshield washer fluid, brake and other hydraulic fluids, steam, and the like, both at room temperature and at elevated temperatures.

Not a fluoropolymer, as these require special and costly alloys to be used in the processing equipment to resist corrosion by hydrofluoric acid that tends to be formed when fluoropolymers are processed at high temperatures, as during extrusion.

Ability to be processed, especially extruded, at temperatures under approximately 650° F. (343° C.).

Sufficiently flexible at room temperature to be processable, e.g., wound onto tubes and braided, at high speeds on standard equipment.

Resistant to abrasion.

Affordability, e.g., no more than approximately $25/pound from the manufacturer.

Both environmentally and employee friendly and safe to process without health concerns and without the necessity of capital investment in fume heads.

Table 2, below, lists data for a large number of polymer families that were considered as possible candidates for the sheath of the multi-filamentary strand. Among the data listed are the glass transition temperature $T_g$ and the melting temperature $T_m$. As mentioned above, in the challenging underhood environment, the glass transition temperature $T_g$ was required to be close to 392° F. (200° C.) while the melting point $T_m$ was required to be less than 700° F. (371° C.) in order to enable processing, in particular, extrusion over the multi-filamentary strand, on standard equipment. The flex modulus, a measure of the material's stiffness, defined more correctly as the ratio of stress to strain in flexural deformation, also had to be not too high, no more than on the order of 1500 Mega Pascals (MPa), preferably no more than 1000 MPa, to allow the sheathed yarns to be processed at room temperature. However, somewhat higher flex modulus values are permissible where the thickness of the polymer is small, as in this application. The densities of the materials and the temperatures at which they undergo complete decomposition, $T_d$, are also shown.

TABLE 2

Properties of Commercial Polymer Categories*

| Polymer Designation | Generic Polymer Nomenclature | Abbreviation | $T_g$ (C) | $T_g$ (F) | $T_m$ (C) | $T_m$ (F) | $T_d$ (C) | $T_d$ (F) | Flex Md (MPa) | Density (g/cm$^3$) |
|---|---|---|---|---|---|---|---|---|---|---|
| Advanced High Performance Polymers | Polyphenylsulphide | PPS | 95 | 203 | 290 | 554 | 530 | 986 | 3700 | 1.37 |
| | Polysulfone | PSU | 190 | 374 | | | 535 | 995 | 2700 | 1.24 |
| | Poly tetrafluroethelene | PTFE | 130 | 266 | 330 | 626 | 580 | 1076 | 750 | 2.23 |
| | Polyvinyldenefluoride | PVDF | 40 | 104 | 175 | 347 | 475 | 887 | 2500 | 1.76 |
| | Tetra/hexa fluoroethylene | FEP | 80 | 176 | 282 | 540 | — | — | 350 | 2.12 |
| | Ethelenettrafluroethelene | ETFE | 90 | 194 | 275 | 527 | 500 | 932 | 1100 | 1.7 |
| | Polyvinylfluoride | PVF | 40 | 104 | 200 | 392 | — | — | 2400 | 1.37 |
| | Polyamide 6-3-T | PA 6-3-T | 153 | 307 | 220 | 428 | 472 | 881 | 2000 | 1.12 |
| | Polyamide 6-3-T | PA 6/6T | 100 | 212 | 300 | 572 | — | — | 3600 | 1.18 |
| | Polyetherimide | PEI | 230 | 446 | 350 | 662 | 527 | 980 | 3000 | 1.27 |
| | Polyethersulfone | PES | 228 | 442 | 260 | 500 | — | — | 2700 | 1.37 |
| | Polyetheretherketone | PEEK | 145 | 293 | 335 | 635 | 600 | 1112 | 3700 | 1.32 |
| | Polyacryletherketoneetherketonek | PEKEKK | 175 | 347 | 390 | 734 | — | — | 4300 | 1.3 |
| | Perfluoroalkoxy | PFA | 100 | 220 | 306 | 583 | 560 | 1040 | 800 | 2.14 |
| | Siloxaned Polyether Imide | Siltem 1600 | 180 | 356 | 340 | 644 | 510 | 950 | 1250 | 1.19 |
| Engineering Polymers | Polyoxymethelene | POM | | | 170 | 338 | | | 3200 | 1.39 |
| | Polyamide | PA 12 | 50 | 122 | 180 | 356 | 464 | 867 | 1400 | 1.01 |
| | Polyamide | PA 6 | 80 | 176 | 235 | 455 | 435 | 815 | 2800 | 1.12 |
| | Polyamide | PA 612 | 65 | 149 | 220 | 428 | — | — | 2100 | 1.06 |
| | Polyamide | PA 66 | 90 | 194 | 265 | 509 | 450 | 842 | 3000 | 1.13 |
| | Polyamide | PA 11 | 50 | 122 | 185 | 365 | — | — | 1400 | 1.03 |
| | Polyamide | PA 46 | 94 | 201 | 290 | 554 | — | — | 3300 | 1.21 |
| | Polyamide | PA 610 | 80 | 176 | 220 | 428 | — | — | 2200 | 1.07 |
| | PolybutaleneTerephthalate | PBT | 60 | 140 | 230 | 446 | 408 | 766 | 2600 | 1.3 |
| | Polyethelenepharaphalate | PET | 80 | 176 | 260 | 500 | 425 | 797 | 3100 | 1.33 |
| | Polycarbonate | PC | 145 | 293 | 170 | 338 | 480 | 896 | 2200 | 1.2 |
| | PolyMethyMethAcrylate | PMMA | 105 | 221 | 320 | 608 | 360 | 680 | 3100 | 1.15 |
| Commodity Polymer | Ethelyne Vinyl Acetate | EVA | 20 | 68 | 110 | 230 | 480 | 896 | 7-120 | 0.92 |
| | Polypropylene | PP | 20 | 68 | 165 | 329 | 447 | 837 | 1800 | 0.9 |
| | Poly Vinyl Chloride | PVC | 80 | 176 | 105 | 221 | 460 | 238 | 25-1600 | 1.16 |

$T_g$ - Glass transition temperature;
$T_m$ - Melting temperature;
$T_d$ - Decomposition temperature;
Flex Md - Flex Modulus
*General Values It can readily be seen from examination of Table 2 that most of the polymers listed fail the first criterion, that is, their glass transition temperature $T_g$ is too low. Such materials unless further chemically modified would be unstable in the harsh environments for which the product is intended. Based on this criterion, only polysulfone (PSU), polyetherimide (PEI), polyether ketone ketone (PEEK), polyethersulfone (PES), polyacryletherketone or polyetherketoneetherketoneketone (PEKEKK) (the complete name being cut-off in the Table) and the siloxane-added PEI sold as Siltem in several grades, as discussed above, are useful. PEEK is known to handle high temperature but is too stiff to be processable as required, and is costly.

As noted the flex modulus of the Siltem 1600 material is 1250 MPa, less than the preferred value of 1500 or less, as above. Somewhat higher modulus material could be used with some limitation of wall thickness.

Table 3, below, lists the polymer systems that were actually tested. Some polymers were tested that did not pass the Tg test, such as PPS and PA, based on recommendations from vendors.

TABLE 3

Selected and Tested Polymer Systems

| Polymer Tested | EY Reference | Polymer Matrix | Cost | Test Justification |
|---|---|---|---|---|
| Nycal HT 7760 | TP 1 | PA 66 | <$4 | Low cost |
| Thermec S 4170 | TP 2 | PPS | <$8 | Low cost |
| Thermec A 3580 | TP 3 | PES | <$10 | Low cost |
| Thermec N 4340 | TP 4 | PPA | <$ 6 | Low cost |
| Thermec N 4870 | TP 5 | PPA Impact | <$12 | Cost |
| Thermec 4871 | TP 6 | PPA Hi Visc | <$15 | Affordability |
| Thermec 4872T3 | TP 7 | PPA Heat Stb | <$15 | Affordability |
| Thermec 4170T3 | TP 8 | PPS Modify | <$12 | Affordability |
| Thermec 4250 | TP 10 | PPSU | <$17 | Affordability |
| Worthern G155D | G155 D | PET High Ht | <$10 | Low cost |
| Worthern G172D | G172D | PET Ht Stab | <$10 | Low cost |
| Ultem 1000 | U1000 | PEI | <$20 | Performance |
| Ultem DT1810EV | U-DT1810 | PEI-Bio | <$20 | Performance |
| Ultem DH 1004 | U-D1004 | PEI -Heat | <$22 | Performance |
| Siltem 1500 | SB 1500 | PEI-Silo | <$25 | Performance |
| Siltem 1600 | SB 1600 | PEI-Silo | <$25 | Performance |
| Siltem 1700 | SB 1700 | PEI-Silo | <$20 | Performance |
| Evoniks- F11 | HR 930 | ETFE | <$20 | Proven Performance |
| Evoniks- F12 | HR 907 | ETFE | <$20 | Proven Performance |
| Evoniks- F13 | 730 AP | ETFE | <$20 | Proven Performance |
| Evoniks PEEK | 4000G | PEEK | <$60 | Proven Performance |
| Evoniks PEEK | 2000G | PEEK | <$60 | Proven Performance |
| Evoniks PEEK | 4000/2000 | PEEK | <$60 | Proven Performance |

Table 4, below, shows the results of a number of chemical resistance tests that were performed on the listed polymer systems. The results for each are provided on two lines, the upper being the result at 70° F. and the lower at 200° F. In these tests, the polymers were tested in plaque form; that is, about 12 grams of pellets of the polymers were melted at the temperatures listed in the column headed "Processing Temp" and cast into molds to form small solid members approximately one inch square and about 20 mils thick. The columns headed "Flow", "Ease of Use", and "Flex" list notes made in the processing step, where the values range between 1 and 10, where 1 represents "the worst" and 10 represents "the best" of each property indicated. As can be seen, the heat stabilized and chemically modified PA66, PPS, PES, and PPA materials received relatively low grades for their difficulty of processing, while the physical/thermal properties of PEI and PET materials showed them to be promising candidates.

As listed, the chemicals to which the plaques were exposed, at room temperature and at elevated temperatures (where the chemical was not flammable, as with gasoline and diesel fuel), included windshield washer fluid ("WF"), antifreeze ("AF"), brake fluid ("BK"), gasoline ("G"), diesel fuel ("DI"), grease ("GR"), transmission fluid ("TF"), engine oil ("O"), and hydraulic fluid ("HF"). In the results listed under the various chemicals, the results are given by numbers between 0 and 5, where 0 represents no change and 5 complete failure.

As can be seen, the tested polymers largely resisted the chemicals, with the exception of the siloxane-modified PEI blends, a number of which failed, in that the surface was blistered to a degree, when exposed to brake fluid at elevated temperature, the PET materials, which cracked when exposed to antifreeze at elevated temperature, and the PEI without siloxane, which cracked when exposed to windshield washer fluid at room temperature. However, the siloxane-modified PEI blends were not removed from consideration following these plaque tests as it was realized that the plaques had not been prepared properly according to the resin supplier's recommendation, in that the pellets provided had not been dried properly.

It will be seen that Table 4 gives a range for the melting temperatures, as the melting point of semi-crystalline amorphous polymers is not a definite value. Other Tables list the Vicat temperature of the various polymers, which is a more definite value for the temperature at which a given polymer is softened to a given degree.

TABLE 4

High Temperature Polymer Evaluation - Chemical Resistance- All Samples are in 20 mil thick Plaques
Chemical Resistance of Selected Polymers - Top row tested at 70 F., Second row at 200 F.

| | | | Thermal Properties | | Physical Properties: 1 = Bad, 10 Best | | | | | | | | | | | |
|---|---|---|---|---|---|---|---|---|---|---|---|---|---|---|---|---|
| | Polymer | | | Proc. | Ease | | Flex | | Resistance to Auto Fluid | | | | | | | |
| | Product | Chem. | Tm | Temp | of | | Mod. | | 0-best; 5-Worst | | | | | | | |
| Vendor | Reference | Prop. | (F.) | (F.) | Flow | use | Flex | MPa | WF | AF | BK | G | DI | GR | TF | O | HF |
| Technical Polymers | HT7760H 3 (TP1) | PA 66 Ht Stab. | 527 572 | 575 | 3 | 3 | 3 | 3000 | 1 0 | 1 0 | 1 | 0 | 1 0 | 0 | 0 0 | 0 | 0 0 |
| | S 4170T3 (TP2) | PPS, IM | 590 644 | 625 | 4 | 4 | 5 | 2300 | 1 0 | 1 0 | 1 | 0 | 0 0 | 0 | 1 0 | 1 0 | 0 |
| | A 3580 (TP3) | PES Low Flo | 608 662 | 635 | 1 | 2 | 2 | 2550 | 0 0 | 0 1 | 1 | 0 | 0 | 0 | 1 0 | 0 0 | 0 1 |
| | N4340T1 H (TP4) | PPA Ht Stabilize | 608 644 | 640 | 1 | 1 | 1 | 2760 | 1 0 | 1 0 | 1 | 0 | 0 | 1 1 | 1 0 | 0 0 | 1 |
| | N4870T1 H (TP5) | PPA Heat Stabilize | 608 644 | 640 | 5 | 5 | 6 | 2600 | 1 0 | 1 0 | 1 | 0 | 1 | 1 1 | 1 | 1 0 | 1 |
| Sabic | Siltem 1500 | PEI-Siloxane | 570 610 | 590 | 8.5 | 8.5 | 8.5 | 379 | 1 0 | 1 4 | 0 | 0 | 1 | 0 | 0 0 | 0 1 | 0 1 |
| | Siltem 1600 | PEI-Siloxane | 590 620 | 620 | 8 | 8 | 8 | 1250 | 0 0 | 0 3 | 0 | 0 | 0 | 0 | 0 0 | 0 1 | 0 1 |
| | Siltem 1700 | PEI-Siloxane | 610 630 | 625 | 7 | 7 | 7 | 2145 | 1 1 | 0 1 | 0 | 0 | 0 | 0 | 0 0 | 1 0 | 0 |
| | Ultem 1000 | PEI | 662 750 | 725 | 2 | 3 | 3 | 3510 | 1 1 | 0 1 | 0 | 1 | 1 1 | 0 1 | 1 0 | 0 | 0 |
| | DT1810 EV | PEI Medical | 626 671 | 660 | 4 | 3 | 4 | 3100 | 0 0 | 0 3 | 1 | 0 | 1 | 0 | 1 0 | 0 2 | 0 1 |
| | DH1004 | PEI Medical | 671 734 | 720 | 3 | 4 | 5 | 2800 | 1 1 | 1 1 | 1 | 0 | 1 1 | 0 | 1 0 | 0 0 | 0 1 |
| AGC Chemical Americas Inc. | HR HR 907 | ETFE | 535 550 | 560 | 8.5 | 8.5 | 8 | 1100 | 0 0 | 0 0 | 0 | 0 | 0 | 0 | 0 0 | 0 | 0 |
| | AGC HR 930 | | 535 550 | 560 | 8.5 | 8 | 8 | 1100 | 0 0 | 0 0 | 0 | 0 | 0 | 0 | 0 0 | 0 | 0 |
| | AGC LM 730-AP2 | | 550 565 | 575 | 8 | 7.5 | 7.5 | 1200 | 0 0 | 0 0 | 0 | 0 | 0 0 | 0 | 0 0 | 0 | 0 |

TABLE 4-continued

High Temperature Polymer Evaluation - Chemical Resistance- All Samples are in 20 mil thick Plaques
Chemical Resistance of Selected Polymers - Top row tested at 70 F., Second row at 200 F.

| Vendor | Polymer | | Thermal Properties | | Physical Properties: 1 = Bad, 10 Best | | | | Resistance to Auto Fluid 0-best; 5-Worst | | | | | | | | |
|---|---|---|---|---|---|---|---|---|---|---|---|---|---|---|---|---|---|
| | Product Reference | Chem. Prop. | Tm (F.) | Proc. Temp (F.) | Flow | Ease of use | Flex | Flex Mod. MPa | WF | AF | BK | G | DI | GR | TF | O | HF |
| Worthern | G1155D | PET | 397 | 420 | 9 | 9 | 9 | 205 | 0 | 0 | 0 | 0 | 0 | 0 | 1 | 0 | 0 |
| | | | | | | | | | | 4 | 4 | | | 0 | 0 | 0 | 0 |
| | G172D | PET | 425 | 445 | 8.5 | 8.5 | 8.5 | 540 | 0 | 4 | 4 | 0 | 0 | 0 | 0 | 0 | 0 |
| | | | | | | | | | | | | | | 0 | 0 | 0 | 0 |

WF - Washer Fluid;
AF - Anti Freeze;
BK - Brake Fluid;
G - Gasoline;
DI - Diesel;
GR - Grease;
TF - -Transmission Fluid,
O - Oil;
HF - Hydraulic Fluid;
Tm - Melting Temperature Range;
Flex - Pliability;
Flex Mod - Flex Modulus The next step was the fabrication of polymer-sheathed multi-filamentary strands and their testing. A number of polymer-sheathed multi-filamentary strands were fabricated as described above, with the glass/Kevlar® cores, in several different diameters, and employing various candidate polymers selected from those that had survived the chemical testing in plaque form. These tests are summarized in Table 5, which comprises Table 5(a) and (b), below. As can be seen, the polymers tested all performed well upon exposure to the chemicals listed. However, the polymers suggested by one resin supplier, Technical Polymers, all provided some difficulty in processing, as noted on Table 5(b). By comparison, the siloxane-modified PEI polymers listed on Table 5 (a) were readily processed to manufacture the polymer-sheathed multi-filamentary strands. It will also be observed that several different blends of the Siltem materials were tried, in order to optimize the tradeoff between ease of processing and resistance to degradation at high temperatures, as discussed above.

TABLE 5a

High Temperature Polymer Evaluation - Chemical Resistance- All Samples are in Yarn form
Chemical Resistance of Selected Siltem Polymers - Top row tested at 70 F., Second row at 200 F.

| Vendor | Polymer | | Thermal Properties | | Physical Properties 1 = Bad, 10 = Best | | | | Resistance to Auto Fluid 0-best; 5-Worst | | | | | | | | |
|---|---|---|---|---|---|---|---|---|---|---|---|---|---|---|---|---|---|
| | Product Ref. | Chem. Property | Tm (F.) | Proc. Tem. (F.) | Flow | Ease of use | Flex | Flex Mod. MPa | WF | AF | BK | G | DI | GR | TF | O | HF |
| Sabic | Siltem 1600-5 | PEI Siloxaned | 590 620 | 620 | 8.5 | 8 | 7.5 | 1250 | 0 | 0 0 | 0 0 | 0 | 0 | 0 0 | 0 0 | 0 0 | 0 0 |
| | Siltem 1600-B | PEI Siloxaned | 590 620 | 620 | 8.5 | 8 | 7.5 | 1250 | 0 | 0 0 | 0 0 | 0 | 0 | 0 0 | 0 0 | 0 0 | 0 0 |
| | Siltem 1600-C | PEI Siloxaned | 590 620 | 620 | 8.5 | 8 | 7.5 | 1250 | 0 | 0 0 | 0 0 | 0 | 0 | 0 0 | 0 0 | 0 0 | 0 0 |
| | Siltem 1600-D) | PEI Siloxaned | 590 620 | 620 | 8.5 | 8 | 7.5 | 1250 | 0 | 0 0 | 0 0 | 0 | 0 | 0 0 | 0 0 | 0 0 | 0 0 |
| | Siltem 1600-E) | PEI Siloxaned | 590 620 | 620 | 8.5 | 8 | 7.5 | 1250 | 0 | 0 0 | 0 0 | 0 | 0 | 0 0 | 0 0 | 0 0 | 0 0 |
| Sabic | SiltemSB 1615-M | Siltem* 7% mixed | 580 615 | 600 | 9 | 8.5 | 8.5 | <1250 | 0 | 0 0 | 0 0 | 0 | 0 | 0 0 | 0 0 | 0 0 | 0 0 |
| | SiltemSB 1615-N | Siltem* 15% mix | 580 615 | 600 | 9.5 | 9 | 9 | <1250 | 0 | 0 0 | 0 1 | 0 | 0 | 0 0 | 0 0 | 0 0 | 0 1 |
| | SiltemSB 1615-J | Siltem* 20% mix | 580 615 | 600 | 9.5 | 9.5 | 9.5 | <1250 | 0 | 0 0 | 0 1 | 0 | 0 | 0 0 | 0 0 | 0 0 | 0 1 |
| Sabic | Siltem 1700-10 | PEI Siloxaned | 610 630 | 635 | 6.5 | 6.5 | 6 | 2145 | 0 | 0 0 | 1 1 | 0 | 1 | 0 0 | 0 1 | 0 0 | 0 0 |
| | Siltem | PEI | 610 | 635 | 6.5 | 6.5 | 6 | 2145 | 0 | 0 | 0 | 0 | 0 | 0 | 0 | 0 | 0 |

TABLE 5a-continued

High Temperature Polymer Evaluation - Chemical Resistance- All Samples are in Yarn form
Chemical Resistance of Selected Siltem Polymers - Top row tested at 70 F., Second row at 200 F.

| Vendor | Polymer Product Ref. | Chem. Property | Tm (F.) | Proc. Tem. (F.) | Flow | Ease of use | Flex | Flex Mod. MPa | WF | AF | BK | G | DI | GR | TF | O | HF |
|---|---|---|---|---|---|---|---|---|---|---|---|---|---|---|---|---|---|
|  | 1700-10 | Siloxaned | 630 |  |  |  |  |  |  |  |  |  |  | 0 | 0 | 0 | 0 |
|  | Siltem | PEI | 610 | 635 | 6.5 | 6.5 | 6 | 2145 | 0 | 1 | 1 | 0 | 1 | 0 | 1 | 0 | 0 |
|  | 1700-2 | Siloxaned | 630 |  |  |  |  |  |  | 0 | 1 |  |  | 0 | 2 | 0 | 0 |
|  | Siltem | PEI | 610 | 635 | 6.5 | 6.5 | 6 | 2145 | 0 | 1 | 1 | 0 | 0 | 0 | 1 | 0 | 0 |
|  | 1700-12 | Siloxaned | 630 |  |  |  |  |  |  | 0 | 0 |  |  | 0 | 1 | 0 | 0 |

*To customize the physical properties, a small amounts of Siltem 1500 is added to Siltem 1600
WF - Washer Fluid;
AF - Anti Freeze;
BK - Brake Fluid;
G - Gasoline;
DI - Diesel;
GR - Grease;
TF - Transmission Fluid,
O - Oil:
HF - Hydraulic Fluid;
Tm - Melting Temperature;
Flex - Pliability;
Flex Mod - Flex Modulus

TABLE 5b

High Temperature Polymer Evaluation - Chemical Resistance- All Samples are in Yarn form
Chemical Resistance of Selected High Temperature Polymers - Top Row at 70 F., Second row at 200 F.

| Vendor | Product Reference | Chem. Property | Tm (F.) | Proc. Tem. (F.) | Flow | Ease of use | Flex | Flex Mod. MPa | WF | AF | BK | G | DI | GR | TF | O | HF |
|---|---|---|---|---|---|---|---|---|---|---|---|---|---|---|---|---|---|
| Technical Polymer | HT7760H 3 (TP1) | PA 66 Heat Stab. | 527 | 575 572 | 3 | 3 | 3 | 3000 | 1 0 | 1 0 | 1 | 0 | 1 | 0 0 | 0 0 | 0 | 0 |
|  | S 4170T3 (TP2) | PPS Modified | 590 | 625 644 | 4 | 4 | 5 | 2300 | 1 0 | 1 0 | 1 | 0 | 0 | 0 | 1 0 | 0 | 0 |
|  | A 3580 (TP3) | PES Low Flow | 608 | 635 662 | 1 | 2 | 2 | 2550 | 0 0 | 0 0 | 1 | 0 | 0 | 0 | 1 0 | 0 | 0 |
|  | N4340T1 H (TP4) | PPA Heat Stabilized | 608 | 640 644 | 1 | 1 | 1 | 2760 | 0 1 | 1 0 | 1 | 0 | 0 | 0 | 1 0 | 0 | 0 |
|  | N4870T1 H (TP5) | PPA Heat Stabilized | 608 | 640 644 | 5 | 5 | 6 | 2600 | 1 0 | 1 0 | 1 | 0 | 1 | 1 1 | 1 1 | 1 0 | 1 |
|  | TP 4250 (TP10) | PPSU | 650 | 710 730 | 6 | 5 | 3 | 2410 | 0 1 | 0 1 | 1 | 0 | 0 | 0 1 | 0 0 | 0 | 0 |
| Worthern | G1155D | PET | 397 | 420 | 9 | 9 | 9 | 205 | 0 3 | 0 3 | 0 | 0 | 0 | 0 | 1 0 | 0 | 0 |
|  | G172D | PET | 425 | 445 | 8.5 | 8.5 | 8.5 | 540 | 0 3 | 1 4 | 0 | 0 | 0 | 0 | 0 0 | 0 | 0 |
| Evonics | Evonics 8 | PEEK 2000-4000 | 660 | 735 730 | 3 | 3 | 2 | 4080 | 0 0 | 0 0 | 0 | 0 | 0 | 0 | 1 0 | 0 | 0 |
|  | Evonics 9 | PEEK 2000-4000 | 660 | 720 720 | 3 | 3 | 2 | <4080 | 0 0 | 0 0 | 0 | 0 | 0 | 0 | 0 0 | 0 | 0 |

WF - Washer Fluid;
AF - Anti Freeze;
BK - Brake Fluid;
G - Gasoline;
DI - Diesel;
GR - Grease;
TF - Transmission Fluid,
O - Oil:
HF - Hydraulic Fluid;
Tm - Melting Temperature Range;
Flex - Pliability;
Flex Mod - Flex Modulus Next, a series of long-term tests at high temperature were conducted. The results are shown in Table 6, comprising Tables 6 (a)-(e), below. As indicated thereon, Table 6(a) refers to a test extending over a period of four weeks, during which yarns manufactured as above and employing the polymers listed as the material of the sheath were put into an oven at 347° F. (175° C.). The numerical results listed with respect to the various polymers range from 1 to 10, where 1 represents complete failure and 10 no noticeable effect. As can be seen, the several products suggested by Technical Polymers listed failed, as did PET, while of the siloxane-modified PEI polymers, the Siltem 1600 and 1700 performed well, while the Siltem 1500 showed signs of degradation.

Table 6 (c) shows the results of similar tests carried out at 392° F. (200° C.) for nine weeks, on multiple polymer-sheathed multi-filamentary strands in varying diameters, averaging 31.5, 37.8 and 41.6 mils, and processed at speeds of around 800 ft/min. As can be seen the Siltem 1600 siloxane-modified PEI polymer performed well while the Siltem 1700 and the other polymers tested failed to one degree or another. The Siltem 1500 had been eliminated from further testing due to its earlier failures. More specifically, the poor results shown for the Siltem 1700 were due to excessive stiffness, which would likely lead to failure in service.

TABLE 6(a)

Heat Tolerance of Selected Polymer Yarns at 347° F. (175° C.)

| | Polymer | | Heat Tolerance: 1-Bad, 10-Intact; Wk = Week | | | | |
|---|---|---|---|---|---|---|---|
| Vendor | Product Reference | Base Chemistry | Wk 0 | Wk 1 | Wk 2 | Wk 3 | Wk 4 |
| Technical Polymers | HT 7760H3 (TP1) | PA66 Heat Stab. | 10 | 7 | 6 | Failed | |
| | S 4170T3 (TP2) | PPS, Injection | 10 | 7 | 6 | Failed | |
| | A 3580 (TP3) | PES Low Flow | 10 | 7 | 6 | 4 | Failed |
| | N 4340T1H (TP4) | PPA Heat Stabl | 10 | 7 | 5 | Failed | |
| | N 4870T1H (TP5) | PPA Heat Stabl | 10 | 7 | Failed | | |
| | T 4871 (TP 6) | PPA Hi Viscous | 10 | 5 | 5 | Failed | |
| | 4872T3H (TP 7) | PPA | 10 | 5 | 5 | Failed | |
| | PPS (TP 8) | PPS | 10 | 5 | 5 | Failed | |
| | 4250 (TP 10) | PPSU | 10 | 8 | 6 | 4 | Failed |
| Sabic | Siltem 1500 | PEI-Siloxaned | 10 | 10 | 9 | 8 | 7 |
| | Siltem 1600 | | 10 | 10 | 10 | 10 | 10 |
| | Siltem 1700 | | 10 | 10 | 10 | 10 | 10 |
| Worthern | G155D | PET | 10 | Failed | | | |
| | G172D | | 10 | Failed | | | |

Table 6(b) similarly reports on the results of comparable tests performed at 392° F. (200° C.), that is, at the target temperature for the product, for four weeks. These results essentially confirm those of Table 6(a), that is, the siloxane-modified PEI Siltem 1600 and 1700 performed well, while the polymers suggested by Technical Polymers, PET, and the Siltem 1500, did poorly.

TABLE 6(b)

Heat Tolerance of Selected Polymer Yarns at 392° F. (200° C.)

| | Polymer | | Heat Tolerance 1-Bad, 10-Intact; Wk = Week | | | | |
|---|---|---|---|---|---|---|---|
| Vendor | Product Reference | Base Chemistry | Wk 0 | Wk 1 | Wk 2 | Wk 3 | Wk 4 |
| Technical Polymers | HT 7760H3 (TP1) | PA66 Heat Stab. | 10 | 2 | Failed | | |
| | S 4170T3 (TP2) | PPS, Injection | 10 | 5 | Failed | | |
| | A 3580 (TP3) | PES Low Flow | 10 | 6 | 4 | Failed | |
| | N 4340T1H (TP4) | PPA Heat Stabl | 10 | 4 | Failed | | |
| | N 4870T1H (TP5) | PPA Heat Stabl | 10 | 2 | Failed | | |
| | T 4871(TP 6) | PPA Hi Viscous | 10 | 2 | Failed | | |
| | 4872T3H (TP 7) | PPA | 10 | 3 | Failed | | |
| | PPS (TP 8) | PPS | 10 | 5 | 3 | Failed | |
| | 4250 (TP 10) | PPSU | 10 | 8 | 8 | 8 | 8 |
| Sabic | Siltem 1500 | PEI-Siloxaned | 10 | 6 | 4 | 3 | Failed |
| | Siltem 1600 | | 10 | 10 | 10 | 10 | 10 |
| | Siltem 1700 | | 10 | 9 | 9 | 9 | 9 |
| Worthern | G155D | PET | 10 | Failed | | | |
| | G172D | | 10 | Failed | | | |

TABLE 6(c)

Heat Tolerance of Selected Polymer Yarns at 392° F. (200° C.)

| Vendor | Polymer Inventor's Reference | Base Chemistry | Heat Tolerance 1-Bad, 10-Intact; Wk = Week |  |  |  |  |  |  |  |  |  |  |
|---|---|---|---|---|---|---|---|---|---|---|---|---|---|
| | | | Wk 0 | Wk 1 | Wk 2 | Wk 3 | Wk 4 | Wk 5 | Wk 6 | Wk 7 | Wk 8 | Wk 9 | Wk 10 |
| Technical Polymers | S 4170T3 (TP2) | PPS, Injection | 10 | 6 | 5 | Fail | | | | | | | |
| | N 4870T1H (TP5) | PPA Heat Stabl | 10 | 6 | 5 | Fail | | | | | | | |
| | T 4871 (TP 6) | PPA Hi Viscous | 10 | 6 | 5 | Fail | | | | | | | |
| | 4872T3H (TP 7) | PPA | 10 | 7 | 6 | Fail | | | | | | | |
| | 4250 (TP 10) | PPSU | 10 | 8 | 7 | 7 | 7 | 7 | 7 | 6 | 2 | Fail | |
| Sabic | Siltem 1600B | PEI-Siloxaned | 10 | 10 | 10 | 10 | 10 | 10 | 10 | 10 | 10 | 10 | 10 |
| | Siltem 1600D | | 10 | 10 | 10 | 10 | 10 | 10 | 10 | 10 | 10 | 10 | 10 |
| | Siltem 1700 | | 10 | 10 | 10 | 10 | 10 | 10 | 10 | 8 | 8 | 7 | 4 |

Table 6(d) shows the results of similar tests also carried out at 392° F. (200° C.) for nine weeks, on multiple polymer-sheathed multi-filamentary strands in varying diameters, averaging between 23.3 and 33.5 mils, and processed at between 700-800 ft/min, as listed. In these tests, several strands sheathed in the Siltem 1600 material were tested and performed well. Also shown on Table 6(d) are tests conducted simultaneously on plaques of ETFE, which also held up well, as indicated.

the siloxane-modified PEI, possibly the cost of custom alloy extrusion equipment could be justified.

Table 6 (e) shows a continuation of the test the results of which are summarized by Table 6(d), for a total of 16 weeks. Again the siloxane-modified PEI polymers performed well. Also shown on Table 6(e) are tests conducted simultaneously on plaques of ETFE, which also held up well, as TABLE 6(d)

Heat Tolerance of Selected Polymer Yarns or Plaques at 392° F. (200° C.)

| Vendor | Polymer Inventor's Reference | Base Chemistry | Heat Tolerance 1-Bad, 10-Intact; Wk = Week |  |  |  |  |  |  |  |  |  |  |
|---|---|---|---|---|---|---|---|---|---|---|---|---|---|
| | | | Wk 0 | Wk 1 | Wk 2 | Wk 3 | Wk 4 | Wk 5 | Wk 6 | Wk 7 | Wk 8 | Wk 9 | Wk 10 |
| Sabic | SB16-11614- A | Siloxaned PEI | 10 | 10 | 10 | 10 | 10 | 10 | 10 | 10 | 10 | 10 | 10 |
| | SB16-11614- B | | 10 | 10 | 10 | 10 | 10 | 10 | 10 | 10 | 10 | 10 | 10 |
| | SB16-11514- 6 | | 10 | 10 | 10 | 10 | 10 | 10 | 10 | 10 | 10 | 10 | 10 |
| | SB16-11514- 9 | | 10 | 10 | 10 | 10 | 10 | 10 | 10 | 10 | 10 | 10 | 10 |
| | SB16-11614- E | | 10 | 10 | 10 | 10 | 10 | 10 | 10 | 10 | 10 | 10 | 10 |
| | SB1615- 117- M | | 10 | 10 | 10 | 10 | 10 | 10 | 10 | 10 | 10 | 10 | 10 |
| AGC Chemicals Americas | AGC- HR 930 | ETFE | 10 | 10 | 10 | 10 | 10 | 10 | 10 | 10 | 10 | 10 | 10 |
| | AGC - HR 907 | | 10 | 10 | 10 | 10 | 10 | 10 | 10 | 10 | 10 | 10 | 10 |
| | AGC- 730 AP | | 10 | 10 | 10 | 10 | 10 | 10 | 10 | 10 | 10 | 10 | 10 |

Due to its corrosive nature, AGC fluoro polymers were not extruded to form yarns but tested as 22 mil plaques ETFE was tested here responsive to a suggestion from a supplier, and was attractive due to low cost, $12-$14/lb. However, ETFE is a fluoropolymer, which was not attractive as discussed above. If the product was notably better than indicated. The "Inventor's reference" column in this table refers to specific test samples. All of the samples prefaced by "SB16" refer to yarns made using the Siltem 1600 polymer, while those prefaced "AGC" refer to plaques of ETFE.

TABLE 6(e)

Heat Tolerance of Selected Polymer Yarns or Plaques at 392° F. (200° C.) - 4$^{th}$ Test

| Polymer Inventor's Reference | Heat Tolerance 1-Bad, 10-Intact; Wk = Week |  |  |  |  |  |  |  |  |  |  |  |  |  |  |  |  |
|---|---|---|---|---|---|---|---|---|---|---|---|---|---|---|---|---|---|
| | Wk 0 | Wk 1 | Wk 2 | Wk 3 | Wk 4 | Wk 5 | Wk 6 | Wk 7 | Wk 8 | Wk 9 | Wk 10 | Wk 11 | Wk 12 | Wk 13 | Wk 14 | Wk 15 | Wk 16 |
| SB16-11614- A | 10 | 10 | 10 | 10 | 10 | 10 | 10 | 10 | 10 | 10 | 10 | 10 | 10 | 10 | 10 | 10 | 9.8 |
| SB16-11614- B | 10 | 10 | 10 | 10 | 10 | 10 | 10 | 10 | 10 | 10 | 10 | 10 | 10 | 10 | 10 | 10 | 10 |
| SB16-11514- 6 | 10 | 10 | 10 | 10 | 10 | 10 | 10 | 10 | 10 | 10 | 10 | 10 | 10 | 10 | 10 | 9.5 | 9.5 |
| SB16-11514- 9 | 10 | 10 | 10 | 10 | 10 | 10 | 10 | 10 | 10 | 10 | 10 | 10 | 10 | 10 | 10 | 9.5 | 9.5 |
| SB16-11614- E | 10 | 10 | 10 | 10 | 10 | 10 | 10 | 10 | 10 | 10 | 10 | 10 | 10 | 10 | 10 | 10 | 10 |
| SB1615- 117- M | 10 | 10 | 10 | 10 | 10 | 10 | 10 | 10 | 10 | 10 | 10 | 10 | 10 | 10 | 10 | 9 | 9 |
| AGC- HR 930 | 10 | 10 | 10 | 10 | 10 | 10 | 10 | 10 | 10 | 10 | 10 | 10 | 10 | 10 | 10 | 9.8 | 9.8 |
| AGC - HR 907 | 10 | 10 | 10 | 10 | 10 | 10 | 10 | 10 | 10 | 10 | 10 | 10 | 10 | 10 | 10 | 10 | 10 |
| AGC- 730 AP | 10 | 10 | 10 | 10 | 10 | 10 | 10 | 10 | 10 | 10 | 10 | 10 | 10 | 10 | 10 | 9.5 | 9.5 |

Standard heat test duration requirement-7 days;
Current test-110+ days;
9+ means a minor change in color In the samples above, the yarns labeled SB16-11614A, -11614B, -11514-6, -11514-9, 11614-E comprised 100% pure Siltem 1600 in the sheath, while sample SB1615-117-M included 7% Siltem 1500, balance Siltem 1600. It can be seen that this latter yarn showed some sign of deterioration toward the end of the test. However, this product may still be desirable due to the additional flexibility provided due to the inclusion of a relatively small amount of the Siltem 1500 polymer, and as the degradation noted is relatively slight.

The following provides exemplary processing conditions employed to manufacture the polymer-sheathed multi-filamentary strands tested in these experiments:

Sample 1600B was extruded at 800 ft/m at a melt pressure of 3280 psi and melt temperature of 567° F. (297° C.). Average diameter ranged from 27-28 mil. Roundness was rated at 8 of 10 and quality at 8 of 10.

Sample 1600D was extruded at 775 ft/m at a melt pressure of 4330 psi and melt temperature of 564° F. (295° C.). Average diameter ranged from 27-30 mil. Roundness was rated at 7 of 10 and quality at 7 of 10.

Sample 1600E was extruded at 775 ft/m at a melt pressure of 3650 psi and melt temperature of 567° F. (297° C.). Average diameter ranged from 28-29 mil. Roundness was rated at 9 of 10 and quality at 9 of 10.

Those of skill in the art will recognize that these processing conditions would typically be further optimized in bringing the invention into commercial production, and that these parameters are not be construed to limit the invention.

Table 7, below, summarizes the physical properties of the Siltem siloxane-modified polyetherimide materials, and those of the unmodified PEI Ultem 1000, for reference. This data includes the melt flow index (MFI), a value indicative of the ease of flow of the polymer when melted, essentially the inverse of its viscosity, taken at 563° F. (295° C.), and at an extrusion pressure of 6.6 kgf. As indicated, the Siltem 1500 has the highest MFI of 12, the Siltem 1600 a MFI of 8.6, and the Siltem 1700 the lowest MFI of 7. This essentially indicates that the Siltem 1500 is the easiest to extrude and the Siltem 1700 the most difficult. The variation in characteristics of these materials is discussed further below.

TABLE 7

Physical Properties of Siltem and PEI Resin

| Resin | Melting Temperature Tm (F./C.) | Glass Transition* Tg (F./C.) | Vicat Softening Ts (F./C.) | Flex Modulus PSI*** | Flex Modulus MPA**** | Melt Flow Index***** 295 C./6.6 kg |
|---|---|---|---|---|---|---|
| Siltem 1500 | 565/296 | 335/168 | — | 55000 | 379 | 12 |
| Siltem 1600 | 590/310 | 383/195 | 333/167 | 181000 | 1250 | 8.6 |
| Siltem 1700 | 655/345 | 392/200 | 356/180 | 311000 | 2145 | 7 |
| Ultem 1000 | 667/353 | 423/217 | 426/218 | 509000 | 3510 | 9** |

Test Methods-
*DMA;
**@ 337 C.;
***ASTM D790;
****ISO 178;
*****ASTM D1238

The values for temperature referred to in the column headed "Vicat softening" refer to the temperature at which materials that have no definite melting point, such as amorphous polymers, are softened to a defined point. As is well known to the art, the Vicat softening temperature is the temperature at which a specified flat-ended needle penetrates the specimen to the depth of 1 mm under a specific load. The temperature reflects the degree of softening to be expected when a material is used in an elevated temperature application.

Finally, Table 8, below, summarizes results of a number of abrasion resistance tests of polymer-sheathed multi-filamentary yarns made according to the methods described herein, with the first five samples listed all made using the Siltem 1600 polymer and the last three made using varying mixtures of the Siltem 1600 and Siltem 1500 materials. The "Cycles to fail" column refers to abrasion resistance testing. As indicated by the data shown, the quality of the product made using a blend of 7% Siltem 1500, balance Siltem 1600, was good, and this product exhibited good abrasion resistance as well.

TABLE 8

Selected Siltem Running Conditions and End Product Performance

| Vendor | Inventor's Reference | Chemistry | Diameter (mil) | Roundness 1-10 best | Quality 1-10 Best | Yield g/30 yds | Yield % | Cycles to fail |
|---|---|---|---|---|---|---|---|---|
| Sabic | Siltem 1600-5 | PEI Siloxaned | 32-34 | 8 | 7.5 | 11.5 | 73 | 597 |
|  | Siltem 1600-B |  | 27-28 | 8 | 8 | 11.04 | 72 | 654 |
|  | Siltem 1600-C |  | 26-30 | 6 | 7 | 11.71 | 74 | 350 |

TABLE 8-continued

Selected Siltem Running Conditions and End Product Performance

| Vendor | Inventor's Reference | Chemistry | Diameter (mil) | Roundness 1-10 best | Quality 1-10 Best | Yield g/30 yds | Yield % | Cycles to fail |
|---|---|---|---|---|---|---|---|---|
| | Siltem 1600-D | | 28-30 | 8 | 8 | 12.26 | 75 | 658 |
| | Siltem 1600-E | | 28-29 | 9.5 | 9.5 | 15.41 | 80 | 980 |
| Sabic | SiltemSB1615-M | 1600/1500 (7%) | 23-25 | 9 | 9 | 6.45 | 81 | 575 |
| | SiltemSB 1615-N | 1600/1500 (15%) | 28-30 | 8 | 8 | 10.28 | 88 | 373 |
| | SiltemSB 1615-J | 1600/1500 (20%) | 28-29 | 8 | 8 | 8.57 | 86 | 332 |

It will be seen that there is a substantial spread in the abrasion resistance data for the yarns sheathed in pure Siltem 1600. This is due to the fact that these samples were preproduction specimens, and varied somewhat in their processing details. Product made on a commercial scale could be expected to be much more uniform. It will be seen that sample 1600-E had the best result for roundness (essentially a measure of the concentricity of the core and polymer sheath) and quality, and also the highest abrasion resistance; this could be expected in a commercial product.

Therefore, for the reasons explained above, and as a result of the test program detailed with reference to the Tables, the finally-determined preferred embodiment of the polymer-sheathed multi-filamentary strand of the invention comprises a core 20 comprising a glass yarn 24 wrapped in a yarn 26 of an aramid such as Kevlar®, the wrapping being carried out so that between about 10% and about 90% of the surface of the glass yarn 24 is not covered by the aramid yarn 26, with a silane added to the yarn if not previously provided, and the core 20 being sheathed in an extruded sheath of a polyetherimide (PEI) polymer with siloxane added, such as those sold by SABIC as Siltem in grades 1500, 1600, and 1700, and mixtures thereof. Addition of Siltem 1500 increases flexibility and thus simplifies processing, especially braiding, but at the cost of reduction of heat tolerance. By comparison, addition of Siltem 1700 increases heat tolerance at the cost of flexibility. In particular, the most preferred polymer is a mixture of up to 7% Siltem 1500 by weight, balance Siltem 1600. If more than about 10% by weight of the Siltem 1500 is added to Siltem 1600, the ability of the polymer to resist heat is compromised. This was realized in the tests recorded in Table 6(e). More particularly, when Siltem 1500 is added, the heat tolerance is compromised. Above 10%, it can be seen in 5-6 weeks. Below 7% (see sample M in Table 6(e)), the onset of failure is seen in the 15th week.

As discussed above, in some circumstances it may also be desirable to provide shielding against electromagnetic interference (EMI) in a strand intended for use in manufacture of braided covers for wiring harnesses. More specifically, as vehicles in particular become more and more completely controlled by microprocessors, a polymer-sheathed multi-filamentary yarn suitable for braiding into wiring harness covers offering some degree of EMI protection would be useful so as to reduce or eliminate EMI from distorting signals, interrupting communication, and the like.

It will be appreciated that the ideal EMI shield would comprise one or more solid electrically-conductive members separated by dielectric layers that would extend over 100% of the signal-carrying wires within. As a braided wiring harness cover necessarily has gaps between the strands making up the braided cover, and also will have gaps where the various wires and bundles of wires branch off in different directions, no braided cover can provide 100% EMI shielding. Nonetheless some useful EMI protection can be provided by a cover braided of suitably-designed strands; a double-braided covering can be employed to provide additional EMI shielding. FIG. 4 illustrates a strand that can be manufactured generally as above, and that would be useful for such purposes.

As is well understood, the goal of EMI shielding is to provide an electrically-conductive structure surrounding the signal-carrying conductors or equipment to be protected. Typically the conductive structure will be grounded, so that any charge that accumulates can be dissipated. Where the structure is in the form of a conductive and reflective enclosure, in which the electromagnetic energy bounces back and forth until it is converted into thermal or electrical energy, thus being dissipated, it is sometimes referred to as a "Faraday cage".

The simplest way of providing EMI shielding to a signal-carrying wire is to provide the signal-carrying wire as the center of a coaxial cable, provide a dielectric sheath over the wire, and then provide a conductive foil or braid over the sheath. The foil or braid will serve to attenuate, absorb or reflect EMI, and will usually be grounded at both ends by way of connectors. An outer protective polymer layer is usually provided. Such coaxial cables are in wide use and are well-known.

As described above, recently there have been attempts to provide EMI shielding by way of disposition of conductive particles of metal, carbon black, or carbon nanostructures in a polymer matrix separated from the signal-carrying wire. See, e.g., Shah U.S. Pat. No. 9,111,658 and Mann application 2015/0107890. Also generally relevant are Li U.S. Pat. No. 8,735,725, showing a cable employing a polymer containing carbon black so as to make it conductive, serving as an EMI shield, and Eves U.S. Pat. No. 6,828,501, showing a cable comprising braided conductors spaced from one another by an insulating yarn. However, no references are known showing a polymer-coated multi-filamentary strand itself incorporating an EMI shield for use in manufacture of a braided cover for wiring harnesses.

As illustrated by FIG. 4, the strand 51, as in the case of the polymer-sheathed multi-filamentary strand of FIG. 2, comprises a core 52 that is sheathed by one or several layers of polymer, applied by extrusion as described above in connection with FIG. 3. Core 52 may again comprise a glass yarn wrapped in an aramid yarn, or may comprise a conductive material, such as a multi-filamentary copper or steel yarn, or a multi-filamentary yarn of tin- or nickel-plated copper-coated nylon filaments. The first sheathing layer 54 may be a dielectric, such as a polymer, or may comprise a polymer filled or coated with conductive particles, such as metal particles, carbon black or carbon nanostructures, so as to be conductive. The references cited above, incorporated herein by this reference, provide an adequate teaching to one of skill in the art to select and appropriately process such filled polymers so as to become effective conductors and provide EMI shielding. Preferably the conductive particles are provided in sufficient number as to form a continuously-conductive layer. Commonly-assigned U.S. Pat. No. 8,236,376 teaches a method for spraying such conductive particles onto a polymer substrate that could be used in practice of this aspect of the present invention.

Note that addition of carbon nano tubes or carbon black tends to stiffen the polymer, such that the designer must consider balancing the physical properties of the strand against its electromagnetic properties. Metalized micro glass beads might also be employed; these would provide EMI shielding, and would add some weight, but the stiffness of the polymer would not be compromised.

In order to provide effective EMI shielding, the second sheathing layer 56 may similarly comprise a polymer filled with conductive particles, such as metal particles selected for their electromagnetic properties, e.g., steel particles as sold by Daido of Japan, having been processed to maximize their surface area, or silver micro flakes sold by Technic Inc. of Rhode Island, carbon black or carbon nanostructures, or metallized glass micro beads. Alternatively, the surface of sheathing layer 56 may be metallized by "roll to roll" metal deposition, metal powder coating, ink jet printing, or dipping the core through a molten bath of a metal of low melting temperature, followed by passage through a sizing die.

Of these, the "roll to roll" vacuum metallizing process, which is used to deposit a metallic coating on the inside of plastic snack-food bags and the like, would appear promising. Roll to roll metal coating is a standard commercial process, offered, for example, by Dunmore Corporation of Bristol, Pa., that allows deposition of a desired thickness of metal on wide plastic rolls of many thousand yards. Such metallized plastic sheets are commonly used to make, for example, snack-food bags to retain the food freshness.

In the embodiment shown, the metal is deposited on the strand, forming a thin film of metal as layer 56. Layer 56 can be connected to ground as indicated at 62 by a drain wire 60, typically an uninsulated solid wire, or perhaps a metal multi-filamentary wire, disposed alongside or wrapped around the sheathing layer 56 and secured there by an outer protective polymer layer 58, applied in another extrusion step. The central core 52, if formed of conductive materials that have electromagnetic wave reflecting and absorbing properties (for example, a tin- or nickel-coated copper yarn) as indicated above, can also be grounded as indicated at 64. In this way coaxial grounded conductors can be provided, which will provide both reflection and absorption of EMI. Additional layers of conductive material, again, polymers filled with conductive particles or metallic layers, and likewise grounded, may be provided. The EMI-shielding strand thus manufactured can then be braided into a wiring harness cover, as above. The polymers employed may be the preferred siloxane-modified PEI, as described above, where the wiring harness is intended for harsh environments, as also described above. The product will have superior properties with respect to chemical resistance, abrasion resistance, and heat resistance, and will afford a useful degree of EMI protection.

While several preferred embodiments of the invention have been described, the invention is not to be limited thereto, but only by the claims which follow.

What is claimed is:

1. A method for manufacturing a polymer-sheathed multi-filamentary strand for use in manufacture of braided covers for wiring harnesses, comprising the steps of:
    preparing an inner core comprising a multi-filamentary yarn of glass filaments;
    preparing a multi-filamentary yarn of aramid filaments;
    wrapping said multi-filamentary yarn of aramid filaments around said multi-filamentary yarn of glass filaments at a rate so as to leave a substantial fraction of the surface of said multi-filamentary yarn of glass filaments exposed; and
    extruding an outer sheath of a siloxane-modified polyetherimide polymer over the aramid-wrapped multi-filamentary yarn of glass filaments, so that said polymer is adhered to the surface of the glass filaments and forms a sheath over said aramid-wrapped multi-filamentary yarn of glass filaments.

2. The method of claim 1, wherein said fraction of the surface of said multi-filamentary yarn of glass filaments that is exposed after said multi-filamentary yarn of aramid filaments is wrapped thereover is between about 10 and about 90%.

3. The method of claim 1, wherein said step of preparing an inner core comprising a multi-filamentary yarn of glass filaments comprises the step of passing said yarn through a flame, in order to caramelize any starch binder thereon, and roughen and activate the surface of the glass filaments.

4. The method of claim 1, wherein said step of preparing an inner core comprising a multi-filamentary yarn of glass filaments comprises the step of applying a silane or tie layer resin to the glass filaments as an adhesion promoter.

5. The method of claim 1, comprising the further step of filling said outer sheath of a siloxane-modified polyetherimide polymer with electrically conductive particles, selected from the group comprising metal particles, carbon black and carbon nanostructures, to provide shielding against electromagnetic interference.

* * * * *